United States Patent [19]

Plante

[11] 3,837,374

[45] Sept. 24, 1974

[54] TECHNIQUES FOR FORMING SEMICONDUCTOR LEADS

[76] Inventor: Richard E. Plante, 103 Dover St., Somerville, Mass. 02144

[22] Filed: June 21, 1973

[21] Appl. No.: 372,214

[52] U.S. Cl. .................. 140/105, 72/DIG. 10, 140/1

[51] Int. Cl. ............................................ B21f 45/00

[58] Field of Search ............ 140/1, 105; 72/DIG. 10

[56] References Cited

UNITED STATES PATENTS

| | | | |
|---|---|---|---|
| 3,071,166 | 1/1963 | Gutbier | 140/1 |
| 3,147,779 | 9/1964 | Brown | 140/105 |
| 3,427,849 | 2/1969 | Ainsworth et al. | 140/105 |
| 3,515,175 | 6/1970 | Hudson | 140/1 |

*Primary Examiner*—Lowell A. Larson
*Attorney, Agent, or Firm*—Wolf, Greenfield & Sacks

[57] ABSTRACT

A method and apparatus for forming and trimming the leads of a semiconductor device or the like to simplify subsequent insertion into a receptive socket or holes on a printed circuit board or the like. The technique includes the preliminary spreading apart of the ends of the leads to a configuration in which the ends may be aligned with a specially formed die. The die has a plurality of holes which are receptive to the leads when the leads are placed at the entrance to the holes. The body of the semiconductor device then is gripped firmly and is urged downwardly to force the leads substantially along their axes through the holes. The holes and the die are arranged to progressively bend the leads to their final configuration as the leads are advanced axially through the holes. The lower ends of the leads which extend beyond the other end of the die then are trimmed.

21 Claims, 23 Drawing Figures

PATENTED SEP 24 1974

3,837,374

SHEET 4 OF 6

TECHNIQUES FOR FORMING SEMICONDUCTOR LEADS

BACKGROUND OF THE INVENTION

Typical semiconductor devices, such as integrated circuits, now in common use include solid state microcircuitry sealed within a housing. A plurality of leads extend from the housing for connection to the circuit in which the device is to be used. The housing usually includes an encapsulating resin or glass through which the leads extend to seal the circuitry within the housing. Semiconductor devices having a plurality of leads often are supplied with the leads extending substantially parallel to each other and of a relatively long length. To incorporate the semiconductor device into the intended circuit, the leads must be formed to the desired configuration and also must be trimmed to the proper length so that they may be easily assembled with the receptive socket or otherwise suitably connected to the printed circuit board. Generally, the lead forming and trimming operation has been a somewhat tedious, cumbersome, time consuming and an expensive procedure. A number of devices and techniques have been proposed to more effectively automate the foregoing procedure. While they have met with varying degress of success, the rate of rejection often still is high in that an undersirable number of devices still are damaged by the forming procedure. This is apparently the result of the relatively fragile and often brittle encapsulating material which is subjected to undue stress during the lead forming operation.

SUMMARY OF THE INVENTION

The method and apparatus of my invention is adapted to bend the leads and to spread them apart to the desired configuration in which the ends are generally parallel to each other so that the ends may be inserted axially into the receptive socket or holes on the printed circuit board. My technique includes the alignment of the ends of the leads with a series of circumferentially spaced holes in a die and then urging the body of the semiconductor device toward the die to force the leads progressively through the parallel holes. The spacing of the die holes is greater than the spacing of the leads at the juncture with the encapsulating material. During the axial advancement of the body of the device, the body is gripped firmly and in a manner in which also surrounds the leads at their juncture with the encapsulating material to preclude excess bending of the leads at that juncture which minimizes any tendency to fracture the encapsulating material. Because the leads of the device, as received from the manufacturer, usually are substantially parallel and spaced closely to each other, it usually is necessary to perform an independent preliminary spreading of the leads to an extent such that their ends can be placed in alignment with the holes in the die in readiness to be urged through the die.

My invention also includes specially designed mechanisms which aid in accurate positioning of the semiconductor device with respect to the anvil.

It is among the objects of my invention to provide an improved method and apparatus for forming the leads of a semiconductor in a "standoff" configuration.

A further object of the invention is to provide a technique for forming the leads of a semiconductor which minimizes damage to the semiconductor device and which, therefore minimizes the rejection rate.

Another object of the invention is to provide an apparatus in which the leads are formed to the "standoff" configuration by simultaneously forcing all of the leads substantially axially through specially formed holes in a die.

A further object of the invention is to provide a new mechanism for holding the body of the semiconductor device while urging the leads axially through the lead forming holes.

Still another object of the invention is to provide an apparatus and method of the type described which requires minimal skill on the part of the operator.

DESCRIPTION OF THE DRAWINGS

The foregoing and other objects and advantages of the invention will be understood more fully from the following detailed description thereof with reference to the accompanying drawings wherein.

DESCRIPTION OF THE PREFERRED EMBODIMENT

Figure 2A:
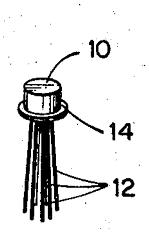
FIGS. 2A, 2B and 2C show various stages of the configuration of the semiconductor device formed in accordance with the invention.
Figure 2B:
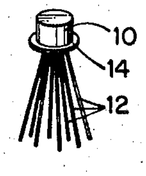
Figure 2C:
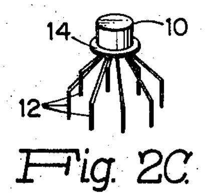

FIG. 2A shows a typical semiconductor device of the type with which the invention is employed. The device includes a housing 10 which contains the semiconductor circuitry. The circuitry typically is encapsulated and sealed within the housing 10 by a glass or resinous material. A plurality of leads 12 extend out of the housing 10 through the encapsulating material. The housing 10 typically includes a flange 14. The semiconductor device usually is received from its manufacturer in the form shown in FIG. 2A in which the leads 12 are substantially longer than necessary and are spaced closely to each other in general parallel configuration. FIG. 2C shows the "standoff" configuration which is desired for proper mounting of the device in the receptive socket, circuit board or the like. In the standoff configuration, the leads have been bent so that their end portions are more separated and extend substantially parallel to each other. In addition, the leads as shown in FIG. 2C have been trimmed to a suitable length. It is the object of my invention to provide an improved method and apparatus by which the leads may be formed to the configuraiton shown in FIG. 2C while minimizing some of the difficulties which have been previously presented.

Figure 1:
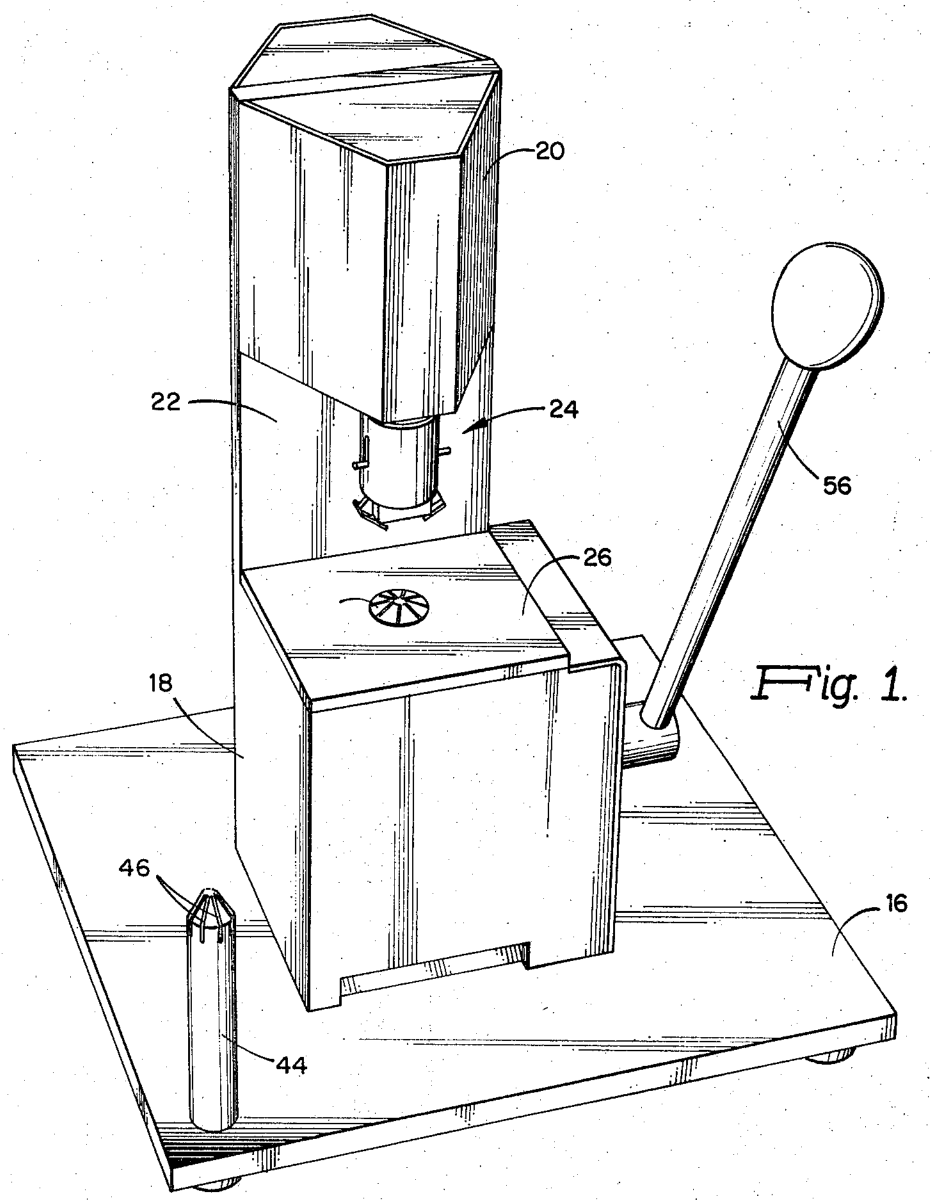
FIG. 1 is an illustration of the apparatus employed in the invention.
Figure 3:
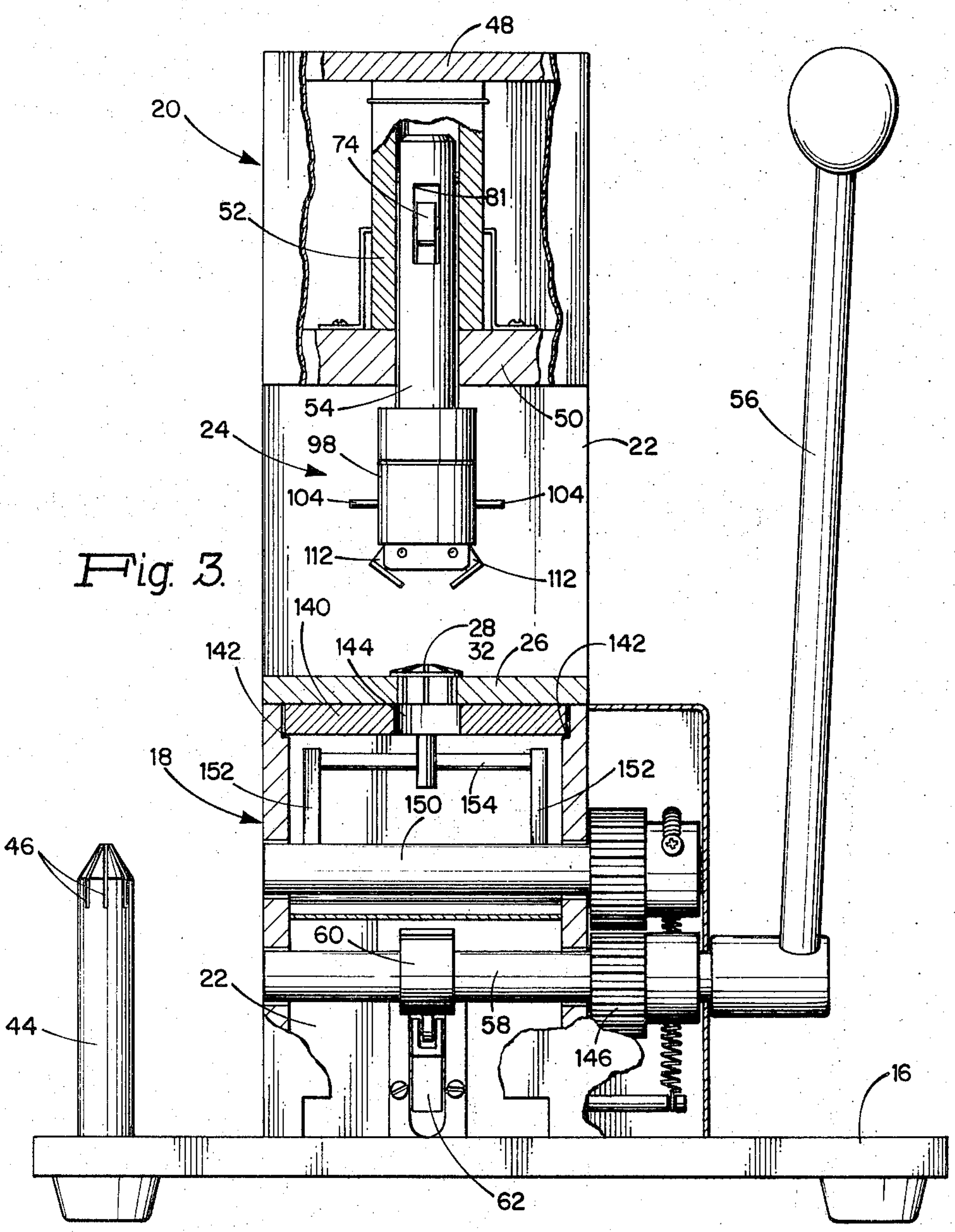
FIG. 3 is a partly sectional front elevation of the apparatus with its covers removed.

As shown in FIGS. 1 and 3, the apparatus for forming the leads of the semiconductor device includes a base 16 which supports the lead forming and trimming mechanisms. These include a lower housing 18 which includes the lead forming die and lead trimming mechanism. An upper housing 20 is supported above the lower housing 18 by a vertical support 22 and supports the chuck, indicated generally by the reference character 24, for vertical movement toward and away from the lower housing 18. The chuck is effective to grip properly the housing 10 of the semiconductor device and to advance it through the lead forming die and trimming mechanisms in the lower housing 18.

Figure 1A:
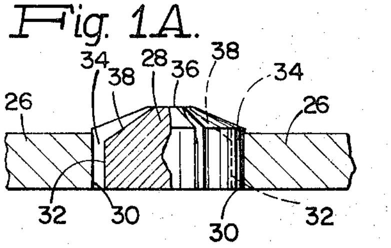
FIG. 1A is a partly sectional enlarged illustration of the die.

The forming die and trimming mechanisms in the lower housing 18 include a die plate 26 which has, at its center, a circular die 28 press-fitted into a receptive hole in the die plate 26, The periphery of the die 28 is provided with a plurality of parallel slots 32 (see FIG. 1A) which cooperate with the hole 30 in the anvil plate 26 to define a plurality of parallel lead receptive passages 34. The lower surface of the die 28 is flush with the lower surface of the die plate 26. The upper end of the die 28 is tapered upwardly and inwardly and has a flattened central section 36. The tapered portion of the die 28 includes a plurality of downwardly inclined radial slots 38 which extend from the flattened center of the upper surface of the dide 28 to the passages 34. The radial slots 38 merge at their outer ends with the passages 34 at a location which is below the level of the upper surface of the anvil plate 26.

Figure 1B:
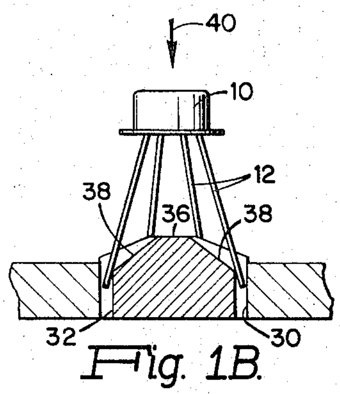
FIG. 1B is a sectional illustration of the die showing the manner in which the leads of the semiconductor device are located in alignment with the die holes.
Figure 1C:
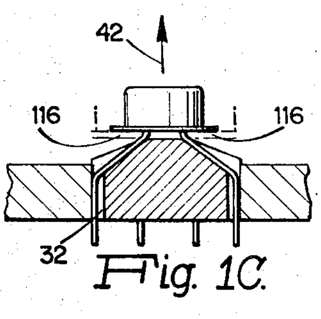
FIG. 1C is an illustration of the die after the semiconductor device has been urged toward the die and showing the leads in their formed "standoff" configuration.

FIGS. 1B and 1C illustrate the manner in which the die is employed to form the leads to the configuration shown in FIG. 2C. The semiconductor device is placed with the ends of its leads near the upper entrance of the passageways 34, each of the leads 12 being associated with one of the sets of slots 38 and passages 34. The semiconductor device then is urged downwardly as suggested by the arrow 40 which causes the leads 12 to be progressively forced and bent through the slots and passages 32, 34 to the standoff configuration shown in FIG. 1C. The ends of the leads 12 which then extend downwardly beyond the lower surface of the die plate 26 and die 28 are trimmed by a mechanism within the housing (described below) and the semiconductor device than can be removed as suggested by the arrow 42. It should be noted that means (described below) also are provided for bracing the leads 12 at their juncture with the encapsulating resin during the foregoing procedure.

In some instances the initial configuration of the leads is such that their ends must be spread preliminarily so that they may be received at the entrance to the passageways 34 properly as suggested in FIG. 1B. This preliminary spreading where necessary, may be performed with the assistance of a prespreading post 44 which may be mounted conveniently to the base 16. The post includes an upper end which is of similar design as that of the plug 28 except that the degree of taper is greater. When the operator determines that some preliminary spreading is desirable, he can locate the semiconductor device over the post 44 with its leads in engagement with the flutes 46 on the post 44 and then urge the semiconductor device downwardly. This preliminary step may also be employed where the leads 12 have become bent out of regularly spaced configuration. In some instances, the use of the post 44 may be omitted and, if any preliminary spreading is required, it may be done directly on the similarly shaped plug 28 itself. The degree of taper of the flutes 46 in the post is such that it imposes negligible stress on the encapsulating resin so that the preliminary spreading operation, when employed, cannot damage the encapsulating material.

Figures 4, 5, 6:
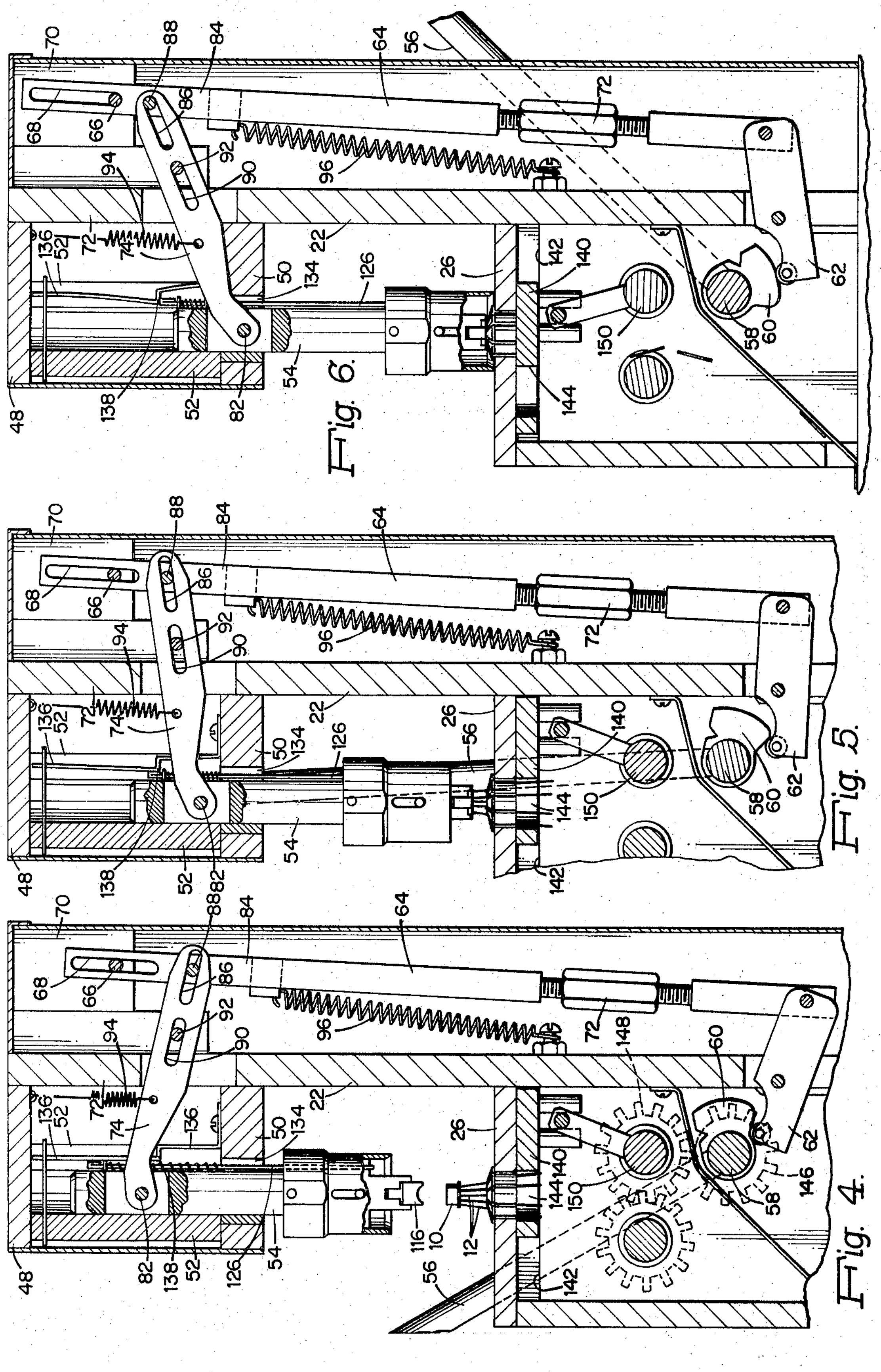
FIGS. 4, 5 and 6 are side elevations, in section, of the apparatus showing various stages in its sequence of operation.
Figure 7:
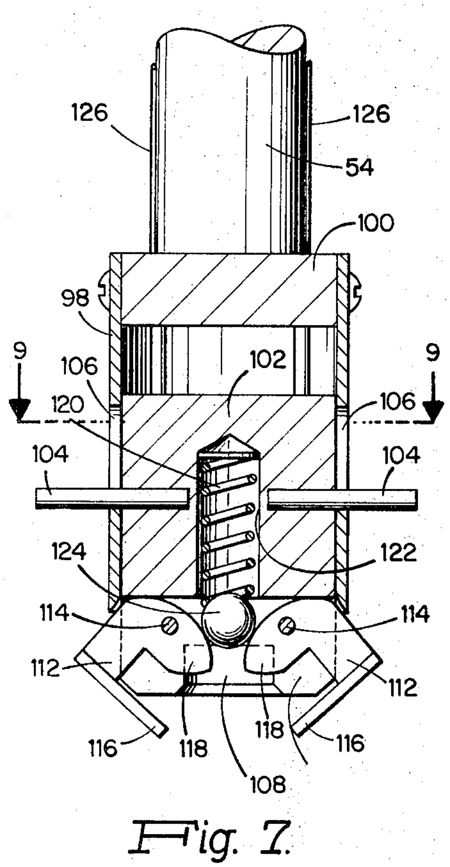
FIG. 7 is a sectional illustration of the chuck for holding the semiconductor device as seen along the lines 7—7 of FIG. 10.

The chuck mechanism 24 is mounted for vertical movement by the upper housing which includes upper and lower shelves 48, 50 secured to the upper end of the vertical support 22 and extending forwardly over the lower housing 18. The lower shelf 50 supports a bushing 52 which, in turn, slidably receives a vertically movable rod 54, the lower end of which, supports the chuck 24. The rod 54 is driven vertically by operation of the handle 56 (see FIG. 1) through a drive train shown in FIGS. 4–6. The drive train includes the shaft 58 and a cam 60 which is secured to the shaft. Rearward rotation of the shaft 58 (clockwise as seen in FIGS. 4–6) drives the rod 54 downwardly toward the lower housing. Rotation of the cam 60 pivots a follower link 62 counterclockwise which, in turn, urges a connecting rod 64, on the rearward side of the vertical support 22, to move upwardly. The upper end of the connecting rod 64 is guided by a pin 66 and slot 68 connected with a bracket 70 secured to the rearward side at the upper end of the vertical support 22. The connecting rod may include an adjustable intermediate portion 72 to enable the effective length of the connecting rod 64 to be varied. The upper end of the connecting rod 64 is connected to the chuck rod 52 by a pivot arm 74 which extends forwardly through receptive slots in the bracket 70, wall 22 and bushing 52. The forwardly extending end of the pivot arm 74 extends into a receptive slot 81 in the upper end of the chuck rod 54 and is pivoted at 82. The rearward end of the pivot arm 74 extends through a vertical slot 84 near the upper end of the connecting rod 64 and has a longitudinal slot 86 which receives a transverse pin 88 extending across the vertical slot 84. The midportion of the pivot arm 72 includes another slot 90 which receives a pin 92 secured to the bracket 70. The foregoing linkage is biased to normally urge the chuck rod 54 in its uppermost position. For this purpose a spring 94 is connected between the upper end of the vertical support 22 and the portion of the pivot arm 74 between the slot 90 and pin 82. In addition, one or more heavier tension springs 96 are connected between the vertical support 22 and the connecting rod 64. With the foregoing arrangement, the various parts are biased in the configuration shown in FIGS. 1 and 4 so that after the handle 56 has been rotated rearwardly to effect the forming and trimming operation they will return to their starting position.

The chuck 24 is shown in more detail in FIGS. 7–10 and includes a cylindrical sleeve 98 which is secured to an enlarged portion 100 of the rod 54 at its lower end. The sleeve 98 houses a cylindrical chuck body 102 which is slidable vertically within the sleeve 98 between upper and lower limits determined by the engagement of lateral pins 104 secured to the chuck body 102 which extend through vertical slots 106 formed in the sleeve 98. The lower end of the chuck body 102, which is exposed through the open lower end of the sleeve 98, includes a centrally formed socket 108 which is dimensioned and shaped to receive the housing 10 of the semiconductor device. Slots 110 are formed at the lower end of the chuck body 102 on opposite sides of the socket 108 and receive a pair of levers 112 pivoted at 114 in the slots 110. Each of the levers 112 has a jaw 116 at its lower end and an inwardly extending finger 118 at its upper end. When in a relaxed configuration (FIGS. 7–10) the levers are biased so that their jaws 116 are spread apart to an open position to expose the socket 108 by means of a compression spring 120 which is captured within a bore 122 in the chuck body 102. The lower end of the spring 120 bears against and urges a ball 124 downwardly against the upper surfaces of the fingers 118. The foregoing parts are dimensioned to limit the extent of opening movement of the levers 112 to that shown in FIG. 7 in which the levers butt up against the upper surface of the slot 110. When in that position, it should be noted that the more outward portions of the levers 112 extend laterally beyond the periphery of the sleeve 98. Further, when in the open receptive configuration shown in FIG. 7 the inner ends of the fingers 118 extend into the socket 108. Means, described below, are provided for normally biasing the chuck body 102 in its lowermost position with respect to the sleeve 98 so that its parts will assume the configuration shown in FIG. 7.

When the chuck mechanism 24 is advanced downwardly toward a previously placed device on the anvil, the socket 108 will be advanced toward and about the housing 10. As the housing 10 enters the socket 108 it engages the inner ends of the fingers 118 which effectively precludes further downward movement of the chuck body 102 and the parts which it supports. Continued advancement of the rod 54 and the sleeve 98 causes the levers 112 to pivot to compress the spring 120 and to cause the jaws 116 to swing inwardly and under the flange 14 of the device. This motion of the levers 112 is assisted by the progressive engagement of the lower edge of the sleeve 98 with the portions of the levers 112 which extend outwardly beyond the sleeve. The inner ends of the jaws are formed to encircle the leads 12 of the device when closed. Once the jaws 116 have been swung fully below the housing 10 to securely hold the housing, continued downward advancement of the rod 54 will cause the upper end of the slots 106 to bear against the pins 104 and thereafter urge the device downwardly and force the leads through the passages 34 as described above. The jaws 116 surround the leads where they join the encapsulating resin or glass so that any lateral stress on the leads which might ordinarily tend to fracture the resin or glass will be taken up by the jaws. The leads then are trimmed by a mechanism within the lower housing 18 described below.

Figure 8:
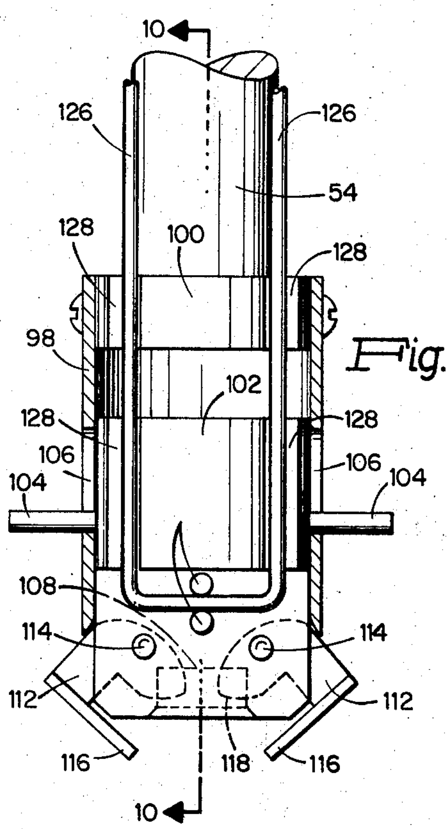
FIG. 8 is an illustration of the chuck as seen along the line 8—8 of FIG. 10 with the outer sleeve in section.
Figure 9:
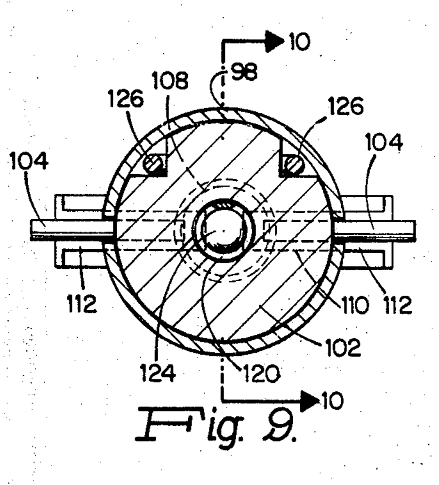
FIG. 9 is an illustration of the chuck in section as seen along the line 9—9 of FIG. 7.
Figure 10:
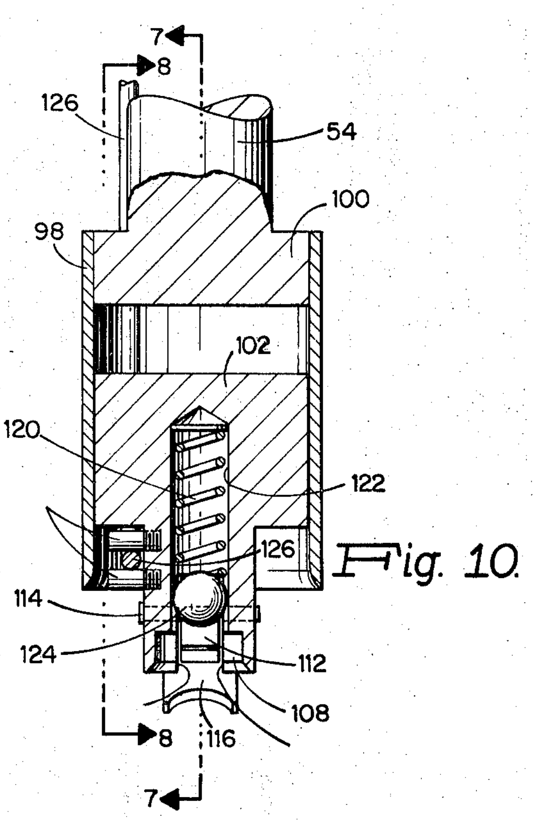
FIG. 10 is a sectional illustration of the chuck as seen along the line 10—10 of FIG. 9.

After the leads have been formed and cut, the handle 56 is released to permit the springs 94, 96 to return the apparatus to its starting position and to release the device from the chuck mechanism. The previously described means for biasing the chuck body downwardly within the sleeve 98 insures that the chuck mechanism will open and release the formed device during the return stroke. This arrangement includes a U-shaped rod 126 which is secured to the chuck body 102 (FIG. 8). The rod 126 extends through receptive longitudinal slots 128 in the body 102 and is retained at its bight by pins 130 secured to the block 102. The upper ends of the rod 126 pass through receptive holes 132 in the lower shelf 50 into longitudinal cut-out portions 134 of the bushing 52. The upper ends of the U-shaped rod 126 are arranged to engage a leaf spring 136 which acts as a yieldable detent. The spring 136 includes a detent portion 138 which, when in a relaxed configuration normally would intercept the upper ends of the U-shaped rod. The upwardly extending ends of the U-shaped rod 126 are dimensioned so that when the chuck mechanism 24 has been advanced to its full downward position, the ends of the rod 26 will advance below the detent portions 138 of the leaf springs 136 to enable the detent portions to spring to their relaxed position (FIG. 6) which will thereafter interfere with the upward return movement of the U-shaped rods. Thus, when the chuck assembly 24 moves upwardly in its return stroke with the rod 54, the ends of the rods 126 will engage the detents 138 to temporarily preclude further upward movement of the chuck body 102. The rod 54 and sleeve 98 are permitted to continue its upward return movement which enables the levers 112 to swing outwardly under the influence of spring 120. This separates the jaws 116, releases the formed device and resets the chuck mechanism 24 for subsequent operation on a new workpiece. When the sleeve 98 has advanced so that the bottom of the slot 106 engages the pins 104 the upper ends of the U-shaped rod 126 will overcome the biasing effect of the detent 138.

FIGS. 3–6 show the lead trimming mechanism which includes a shear plate 140 supported in the lower housing 18 below the die plate 26 for forward-rearward movement on gibs 142 formed on the inner sides of the housing. The shear plate 140 includes a hole 144 which, when the apparatus is in a relaxed position, is in alignment with and below the plug 28. The shear plate 140 is movable from the rearward position (FIG. 4) to a more forward position during which movement the edge in the shear plate 140 which defines the hole 144 shears and trims the ends of the leads 12 which extend downwardly below the anvil plate as shown in FIG. 1C. The shear plate 140 is driven in timed relation to the remainder of the device by a gear train driven by the shaft 58. As shown in FIGS. 3–6, the gear train includes a segmented drive gear 146 which is secured to the shaft 58. The segmented gear 146 is mounted to mesh with a shear plate gear 148 secured to a shaft 150 which extends through the lower housing and is journaled to the sidewalls of the lower housing. A pair of drive cranks 152 are secured to and extend radially upwardly from the shaft 150 and a transverse drive bar 154 is secured to the ends of the drive cranks 152. The bar 154 passes through a trunnion 156 which is secured to the underside of the shear plate 140 to drive the plate 140 forwardly and rearwardly. The segmented gear 146 is arranged with respect to the gear 148 so that the shear plate 140 will be urged forwardly in a shearing action after the leads of the semiconductor device have been fully formed as shown in FIG. 1C. In order to insure full return of the shear plate to its starting position, the plate is biased rearwardly by another gear 158 mounted to the sidewall of the lower housing and in mesh with the gear 149. A tension spring 160 is wrapped about the gear 158 at one end and is secured to the lower housing at its other end as shown in FIG. 3.

Figure 11:
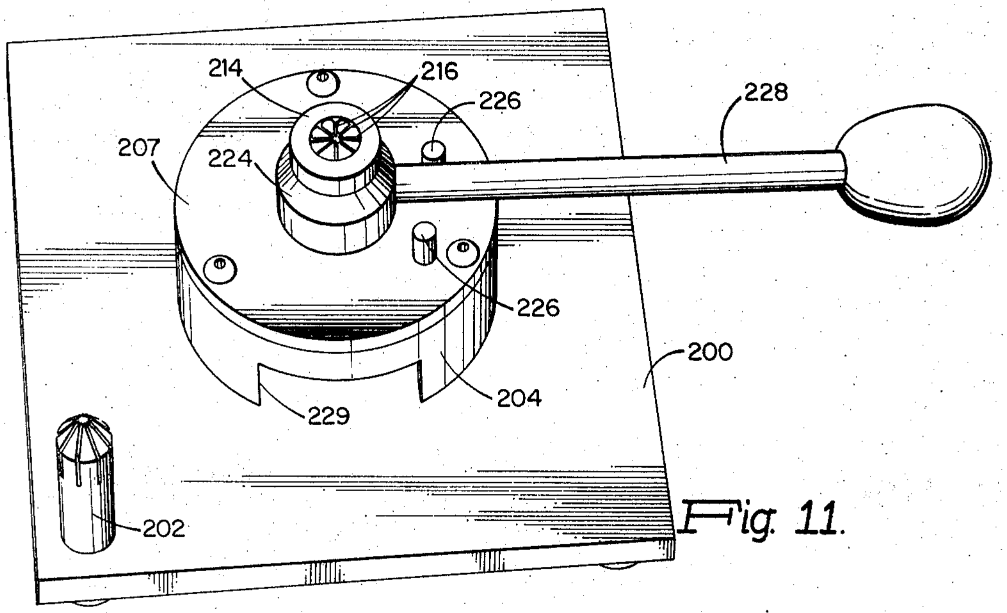
FIG. 11 is an illustration of a simplified form of the invention.
Figure 12:
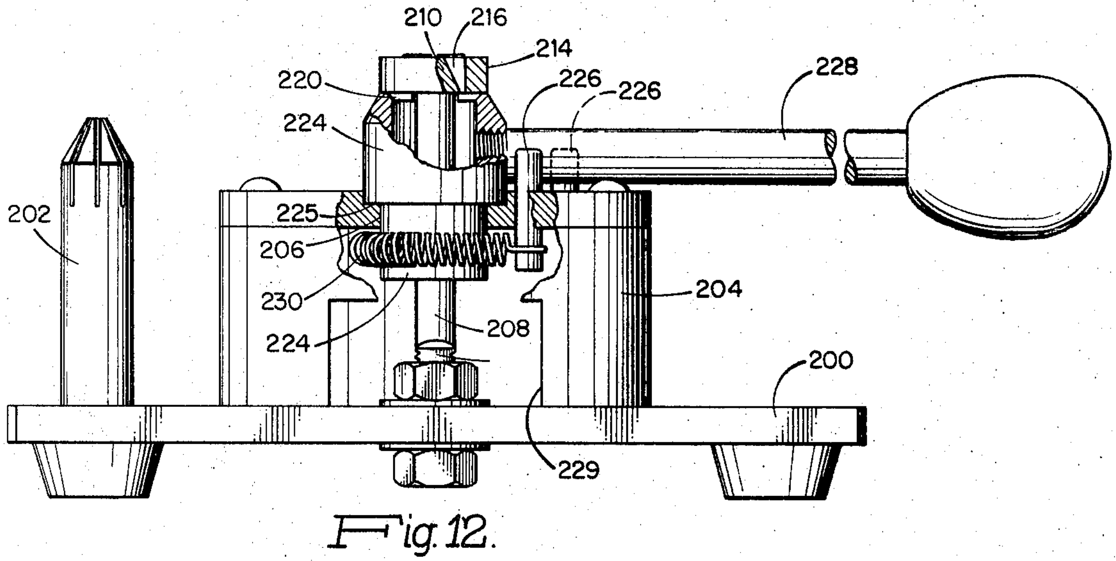
FIG. 12 is an elevation of the device shown in FIG. 11, partly broken away and in section.
Figure 13:
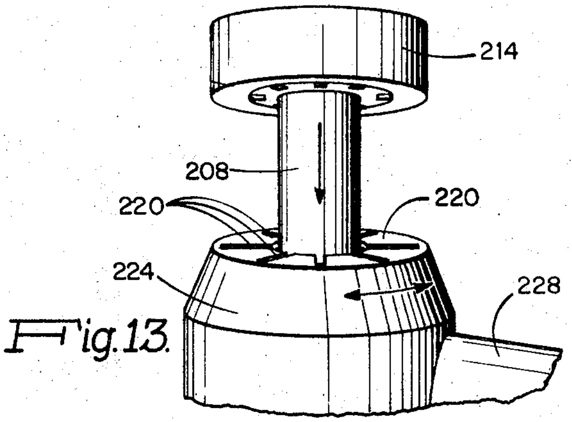
FIG. 13 is a partly exploded illustration of the cutting mechanism of the device shown in FIGS. 11 and 12.

While the foregoing apparatus is suited more for use in mass production techniques, a simplified apparatus may also be employed in less economically controlled environments. FIGS. 11–13 show a simplified apparatus in which the body of the semiconductor device is manipulated by hand rather than being held by an automated chuck, This arrangement includes a base 200 and may also include a fluted prespreading post 202 as in the previous embodiment. The base 200 supports a cylindrical housing 204 which has a central hole 206 in its top wall 207. A post 208 is secured to the base 200 and extends upwardly through the hole 206. The upper end of the post 208 is formed to define a die 210 which has a plurality of downwardly and outwardly radially extending slots 216. The die 210 is surrounded by a circular collar 214 which is secured to the die and which cooperates with the slots 216 to define lead guiding passages in a manner similar to that described in the previous embodiment. The post 208 and collar 214 remain stationary. With this embodiment, the semiconductor device leads are aligned with the radial passages and the body of the device is urged downwardly to form the leads as they pass progressively through the passages. After the leads have been formed their lower free ends are trimmed by an arrangement which includes a rotatable trimming collar 224 which is supported on a shoulder 225 of the top plate 207 and which surrounds the post 208. The upper end of the trimming member 24 includes a plurality of inwardly extending fingers 220 which define cutting slots 225. The part are arranged so that when in a relaxed position, the slots 225 are in alignment with the radial passages defined by the slots 216 so that the lower ends of the leads may extend through slots 225 and below the lower surface of the collar 214 and die 210. The trimming collar 224 then is rotated by means of a handle 228 to trim the lower ends of the leads. The trimmed ends of the leads may be removed from the circular housing 204 through an opening 229. The top plate 207 includes a pair of stop members 226 to limit the extent of rotation of the trimming collar 224. A spring 230 is secured to and wrapped about the lower end of the trimming collar 224 and is secured at its other end to one of the pins 226 within the cylinder housing 204 to bias the handle in a relaxed position in which the cutting slots 225 are in alignment with the radial slots 216 of the die.

Figure 15:
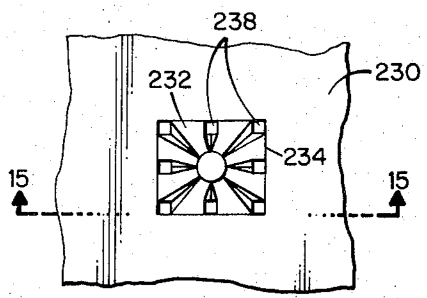
FIG. 15 is a plan view of the die and die plate used to form the lead configuration shown in FIG. 14.
Figure 14:
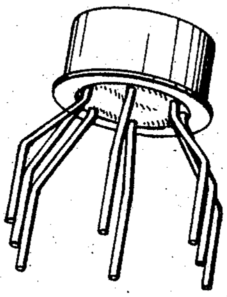
FIG. 14 is a bottom illustration of a semiconductor device having its leads bent into the square standoff configuration.

The invention has been illustrated thus far primarily in the forming of leads in a generally circular pattern about the axis of the device. It should be noted, however, that in some instances it is not uncommon in the art for one to prefer to shape the leads to a configuration other than circular such as, for example, to a rectangular or square configuration as suggested in FIG. 14. The leads may be formed and trimmed to such configurations other than circular by employing a differently shaped die plate 230 and die 232 as suggested in FIGS. 15 and 16. The die plate 230 employs a square or rectangular opening 234, as desired, which receives a similarly shaped square or rectangular die 232 in a snug fit. The die 232 has slots and grooves 236, 238 in the manner similar to the circular embodiment previously described except that they are arranged in the square or rectangular pattern. The upper surface of the die 232 tapers upwardly and inwardly and defines a flat central surface 238. When the leads are to be formed in a non-circular pattern it will be apparent that some of them will necessarily be longer than others if they are all to be trimmed at the same level. This, of course, requires that the leads be sufficiently long in the first instance.

Figure 16:
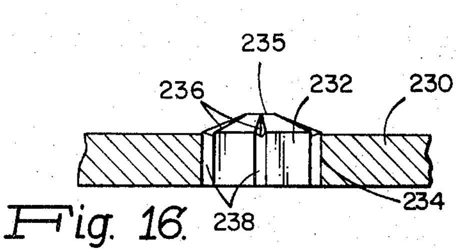
FIG. 16 is an illustration of the die and die plate as seen along the lines 16—16 of FIG. 15.
Figure 18:
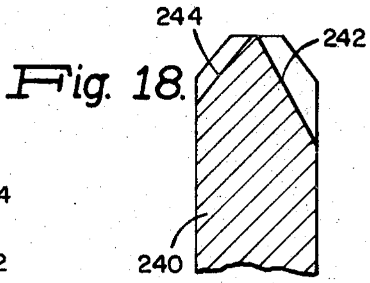
FIG. 18 is a sectional elevation of the post shown in FIG. 17.
Figure 17:
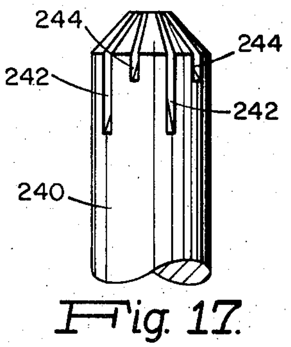
FIG. 17 is a side elevation of the preforming post used with the square die.

In order to prepare the leads preliminarily so that they may be placed on the square or rectangular die in readiness to be urged axially through the die openings, specially designed preforming posts, shown in FIGS. 16 and 17 should be employed. The preforming posts 240 is similar to that shown in FIG. 1 except that the flutes are not of identical depth or angular inclination. As shown in FIGS. 17 and 18, when the square or rectangular configuration is to be employed alternate, shallow and deep grooves 242, 244 are provided so that when the leads are urged down over the preforming posts alternate leads will be bent to different angles so that those which are to be received in the corner openings will be bent at a slightly increased angle to those which are to be received in the openings between the corner openings of the die.

It should be understood that the foregoing description of the invention is intended merely to be illustrative thereof and that other modifications and embodiments may be apparent to those skilled in the art without departing from its spirit.

Having thus described the invention what I desire to claim and secure by Letters Patent is:

1. A method of forming a plurality of leads which extend in generally parallel relation from a housing to a predetermined configuration in which each lead has at least two longitudinally spaced bends comprising:

providing a die which defines a plurality of passages having inlets and outlets, said passages corresponding in number to at least the number of leads to be formed, said passage defining a path and being of a configuration corresponding to said predetermined configuration to which said leads are to be formed;

aligning the ends of said unformed leads with the inlets to said passages; and effecting relative movement of said housing and leads simultaneously with respect to said die and along a direction generally paralleling the direction in which said unformed leads extended form said housing, said leads being formed to said predetermined configuration progressively along their lengths and in response to continued advancement of said leads longitudinally through said passages.

2. A method as defined in claim 1 wherein said leads are longer than the longitudinal dimension of said passages whereby they may protrude beyond the outlets of said passages, said method further comprising:

trimming the ends of said leads which protrude beyond the outlets of said passages.

3. A method as defined in claim 2 wherein said leads extend from an encapsulating material in said housing, said method further comprising:

surrounding said leads adjacent the region where they extend from said encapsulating material at least during said progressive advancement of said leads through said passages to minimize lateral stress imposed on said encapsulating material.

4. An apparatus for forming the leads of a device which has a housing and in which the leads extend from said housing in generally parallel relation to a predetermined configuration in which each lead has at least two longitudinally spaced bends comprising:

die means having an axis and defining a plurality of passages having inlet and outlet ends and surrounding the die axis, each passage being receptive longitudinally to one of said leads, said passages being shaped to define said predetermined configuration, each passage being constructed and arranged to constrain and guide its contained lead progressively and longitudinally through said passage as said lead is advanced longitudinally therethrough, to progressively bend and form said leads to said predetermined configuration in response to said advancement of said leads through said passages.

5. An apparatus as defined in claim 4 wherein said die means is constructed so that each of said passages include a first upper portion extending radially downwardly and outwardly of the axis of said die, and a second portion which extends from the outer end of said first radial portion downwardly substantially parallel to the axis of said die.

6. An apparatus as defined in claim 5 further comprising:

said die means being formed from a substantially cylindrical die plug having a tapered upper end, said first portion of said passages being formed in said tapered upper end, the second portion of said passages being defined in part by a groove formed longitudinally along the periphery of said plug; and a die plate secured to and surrounding the periphery of said plug, said die plate cooperating with said groove to define said second portion of said passages.

7. An apparatus as defined in claim 6 further comprising:

said radial slots and longitudinal grooves being formed so that their juncture is disposed at a level slightly below the upper edge of said die plate.

8. An apparatus as defined in claim 6 wherein the lower surface of said die plate and said die lie in a common plane whereby the lowermost ends of said leads may extend downwardly beyond said common plane; and lead trimming means mounted below said die and die plate to sever the donwardly extending ends of said leads at said plane.

9. An apparatus as defined in claim 4 further comprising:

chuck means constructed and arranged to grip and engage said housing;

means mounting said chuck means for movement toward and away from said die means along a direction which substantially parallels the axis of said die means; and said chuck means being further constructed and arranged to retain said housing in a manner in which said leads may be advanced longitudinally through said passages in response to said movement of said chuck means.

10. An apparatus as defined in claim 9 wherein said chuck means comprises:

means defining a socket receptive to said housing, said socket opening toward said die means to embrace and receive a housing placed on said die means in readiness for said lead forming operation;

said chuck means including means for embracing said leads where they extend from the housing in response to and after said socket has embraced and received said housing, said lead embracing means being constructed and arranged to minimize bending of said leads at their juncture with said housing.

11. An apparatus as defined in claim 10 wherein said means for embracing said leads comprises:

said chuck including a pair of jaws mounted thereto on opposite sides of said socket, said jaws being movable between an open position in which entrance to said socket is fully exposed and a closed position in which they embrace said leads; and means biasing said jaws in said open configuration.

12. An apparatus as defined in claim 11 wherein said means reponsive to entry of said housing into said socket for closing said jaw means comprises:

said jaw means including bellcrank means pivotally mounted to said chuck, said bellcrank means having one end thereof protruding into the upper end of said socket, the jaw means being mounted to the other end of said bellcrank means, said bellcrank being pivoted to said chuck so that when said housing enters into said socket it will engage the ends of said bellcrank which extend into said socket to pivot said bellcrank means and thereby swing said jaw means into said closed position.

13. An apparatus as defined in claim 12 wherein said means for biasing said jaw means in said opened configuration comprises:

means biasing said first mentioned ends of said bellcrank means downwardly and into said socket.

14. An apparatus as defined in claim 9 wherein said means for mounting said chuck for said movement comprises:

a rod slidably mounted for movement along said axial direction and above said die;

means mounting said chuck means for movement both in unison with said rod and with respect to said rod along said axis and between predetermined limits; and means carried by said rod and engageable with said jaw means for supplementally urging said jaw means from said open to said closed position when said chuck means is moved in relation to said rod means toward its upper of said limits.

15. An apparatus as defined in claim 14 further comprising:

said rod including a sleeve at its lower end;

said chuck means including a chuck block slidable within said sleeve, the lower end of said sleeve being engageable with said jaw means to close said jaw means when said chuck block is moved upwardly with respect to and within said sleeve; and said limits of relative movement between said chuck and said rod comprising pin means secured to said chuck block and extending laterally through vertical slots formed in said sleeve.

16. An apparatus as defined in claim 15 further comprising:

means for urging said chuck block to its lowermost position with respect to said sleeve said rod is moved away from said die means to enable said jaw means to move to its open configuration under the influence of said bias means.

17. An apparatus as defined in claim 4 further including means for trimming said leads, said measn comprising:

shear plate means mounted for horizontal reciprocating movement below said die means and die plate, said shear plate means including shear opening means formed therethrough and adapted to receive the ends of said leads to be trimmed;

drive means for effecting reciprocating movement of said shear plate means to sever said ends of said leads; and said drive means including timing means for delaying said reciprocating movement of said shear plate until after said leads have been advanced fully through the openings in said die means.

18. An apparatus as defined in claim 17 wherein said drive means for said rod comprises:

a drive shaft rotatably mounted below said shear plate and having a cam mounted thereto;

linkage means responsive to rotation of said drive shaft and said cam means for advancing said rod toward said die;

said means for reciprocating said shear plate in timed relation comprising a second shaft rotatably mounted below said shear plate and connected through a gear train to said drive shaft; and crank means connecting said second shaft with said shear plate to effect said reciprocating movement thereof, at least one of said gears in said gear train being segmented to effect said delay between actuation of said linkage means and said shear plate means.

19. An apparatus as defined in claim 4 further comprising:

an elongate performing post having a tapered free end, said post including a plurality of flutes extending from near the center of said tapered free end radially and longitudinally of said post.

20. An apparatus as defined in claim 19 wherein each of said flutes are of substantially the same length.

21. An apparatus as defined in claim 19 wherein adjacent of said flutes are of alternating lengths.

* * * * *